(12) United States Patent
Biegelsen et al.

(10) Patent No.: US 6,743,982 B2
(45) Date of Patent: Jun. 1, 2004

(54) STRETCHABLE INTERCONNECTS USING STRESS GRADIENT FILMS

(75) Inventors: David Kalman Biegelsen, Portola Valley, CA (US); David Fork, Los Altos, CA (US); James Reich, Mountain View, CA (US)

(73) Assignee: Xerox Corporation, Stamford, CT (US)

(*) Notice: Subject to any disclaimer, the term of this patent is extended or adjusted under 35 U.S.C. 154(b) by 509 days.

(21) Appl. No.: 09/725,706

(22) Filed: Nov. 29, 2000

(65) Prior Publication Data

US 2002/0094701 A1 Jul. 18, 2002

(51) Int. Cl.[7] .............................................. H01R 4/00
(52) U.S. Cl. ....................................................... 174/69
(58) Field of Search ................... 439/32, 33; 361/776; 174/69, 86, 254; 73/172

(56) References Cited

U.S. PATENT DOCUMENTS

| | | | | |
|---|---|---|---|---|
| 3,300,572 A | * | 1/1967 | Dahlgren et al. | 174/69 |
| 3,818,122 A | * | 6/1974 | Luetzow | 174/86 |
| 3,979,763 A | * | 9/1976 | Mills | 174/86 |
| 4,588,348 A | | 5/1986 | Beni et al. | 414/730 |
| 4,694,231 A | | 9/1987 | Alvite' | 318/568 |
| 4,817,440 A | | 4/1989 | Curtin | 73/862.04 |
| 5,375,397 A | * | 12/1994 | Ferrand et al. | 54/66 |
| 5,613,861 A | | 3/1997 | Smith et al. | 439/81 |
| 5,678,448 A | * | 10/1997 | Fullen et al. | 73/172 |
| 5,848,685 A | | 12/1998 | Smith et al. | 200/275 |
| 5,914,218 A | | 6/1999 | Smith et al. | 430/320 |
| 5,944,537 A | | 8/1999 | Smith et al. | 439/81 |
| 5,979,892 A | | 11/1999 | Smith | 271/267 |
| 6,319,012 B1 | * | 11/2001 | Moessinger et al. | 174/69 |
| 6,360,615 B1 | * | 3/2002 | Smela | 73/862.474 |

FOREIGN PATENT DOCUMENTS

| DE | 4038394 | * | 6/1992 |
|---|---|---|---|
| JP | 6-36620 | * | 2/1994 |

\* cited by examiner

*Primary Examiner*—Neil Abrams
(74) *Attorney, Agent, or Firm*—Perman & Green LLP

(57) ABSTRACT

A stretchable interconnect for electrically connecting electronic devices comprises a photolithographically patterned conductor extending between two of said devices for electrically coupling a contact of one device to a contact of another device. The stretchable interconnect preferably comprises a coiled conductor. The coiled conductor is formed of a metal or alloy having a stress gradient extending through a thickness of said conductor. A sensor array employs the stretchable interconnects to connect contacts of one electronic device to another electronic device. The sensor array can be employed in a flexible or stretchable sensing skin of a robot as well as other applications. The stretchable interconnects can be formed by a photolithographic process on the same substrate which supports the electronic devices. The interconnects become stretchable when the supporting substrate is removed from the interconnect. Preferably coils which are formed are di-helic.

24 Claims, 10 Drawing Sheets

STRETCHABLE INTERCONNECTS USING STRESS GRADIENT FILMS

BACKGROUND OF THE INVENTION

1. Field of the Invention

This invention relates to stretchable interconnects employing stress gradient films. The stretchable interconnects are particularly suitable for flexibly connecting movable sensors in arrays such as the tactile sensitive skins of robots.

2. Prior Art

Photolithographically patterned spring contacts having a stress gradient formed therein which causes the spring contact to bend away from a substrate to provide an interconnect have been described in U.S. Pat. Nos.: 5,613,861 to Smith et al., U.S. Pat. No. 5,848,685 to Smith et al., U.S. Pat. No. 5,914,218 to Smith et al., U.S. Pat. No. 5,944,537 to Smith et al. and U.S. Pat. No. 5,979,892 to Smith. U.S. Patent Applications Nos.: 09/573,815 for "Photolithographically Patterned Out-Of-Plane Coil Structures And Method Of Making", to Chua et al. and 09/572,200 for "Method of controlling stress anisotropy in thin film structures" to inventor David Fork also relate to photolithographically patterned spring contacts. These patents and patent applications are specifically incorporated by reference herein in their entirety.

In robotic design it would be useful to have surface coatings or skins embedded with sensors and control hardware. Such a skin needs to be flexible and stretchable to conform to tactile movement or to movable appendages. Providing stretchable interconnects which can withstand such deformation is a major challenge.

A variety of tactile sensing skins have been employed in robots in an effort to sense applied force levels, torque levels, etc. and the position of the work piece which is being acted upon by the robot. U.S. Pat. Nos.: 4,588,348 to Beni et al., U.S. Pat. No. 4,694,231 to Alvite, and U.S. Pat. No. 4,817,440 to Curtin are illustrative of robots employing such tactile sensing skins. These patents are specifically incorporated by reference herein in their entirety.

SUMMARY OF THE INVENTION

In accordance with this invention there is provided a stretchable interconnect for electrically connecting electronic devices which are supported for movement relative to one another. The interconnect comprises a photolithographically patterned stretchable conductor extending between two of the electronic devices for electrically coupling a contact of one device to a contact of another device. Preferably the interconnect comprises a coiled conductor. The coiled conductor is comprised of a conductive material having a stress gradient extending through at least a portion of the thickness of the conductor.

In a preferred embodiment the stretchable interconnect is photolithographically patterned and comprises at least one "V" shaped section, which, when unsupported, forms the stretchable interconnect which is preferably a coil. Most preferably the interconnect comprises a plurality of "V" shaped sections, which, when unsupported forms the stretchable interconnect, which is preferably a coil. Preferably the coiled conductor of the stretchable interconnect is di-helic, and is made up of segments having right-handed and left-handed helical windings.

In accordance with yet another embodiment of the invention a sensor array is provided which comprises at least two electronic devices which are supported for movement relative to one another and at least one stretchable interconnect for connecting the electronic devices. As in the previous embodiment the interconnect comprises: a photolithographically patterned conductor extending between the devices for electrically coupling a contact of one device to a contact of another device. The conductor is preferably a coil which is formed of a conductive material and has a stress gradient extending through a thickness of the conductor. The interconnect as photolithographically patterned preferably comprises at least one "V" shaped section, which when unsupported, forms a stretchable interconnect which preferably is in the form of a coil. Most preferably it comprises a plurality of "V" shaped sections, which when unsupported form the stretchable interconnect. The coil form of the interconnect is most preferably di-helic.

The sensor array preferably comprises a tactile sensing array. In a particularly preferred embodiment the sensing array comprises a tactile sensing portion of a robot. The sensor array in accordance with the preferred embodiment is arranged in a flexible and stretchable skin of the robot. The sensor array preferably includes a plurality of the stretchable interconnects.

In accordance with yet another preferred embodiment of the invention a process is provided for making a stretchable interconnect for electrically connecting electronic devices which are supported for movement relative to one another. The process comprises forming the devices supported by a substrate, the devices being spaced apart from each other as supported by the substrate. An interconnect conductor is deposited which is supported by the substrate for electrically coupling a contact of one electronic device to a contact of another electronic device. The interconnect conductor is preferably formed with a stress gradient extending through at least a portion of the thickness of the conductor. The interconnect conductor is photolithographically patterned with a pattern which upon removal of the substrate from support of the interconnect conductor will cause the interconnect conductor to form a stretchable interconnect which is preferably in the form of a coil.

In a preferred embodiment of the process the interconnect conductor as photolithographically patterned and prior to substrate removal comprises at least one "V" shaped section, which when unsupported forms the stretchable interconnect which is preferably in the form of a coil. In an even more preferred embodiment the photolithographically patterned interconnect conductor comprises a plurality of "V" shaped sections, which when unsupported form the stretchable interconnect which is preferably in the form of a coil. Most preferably the interconnect conductor when unsupported is a di-helic coil.

In a further embodiment of the invention the process further includes forming a sensor array having more than two electronic devices and including a plurality of stretchable interconnect conductors connecting adjacent electronic devices. The process preferably further comprises mounting the sensor array to a flexible and stretchable skin material. The sensor array preferably comprises a tactile sensing array which most preferably comprises a tactile sensing portion of a robot.

This invention is aimed at providing an improved stretchable interconnect for electrically connecting electronic devices which are supported for movement relative to one another. It is also aimed at providing an improved sensor array employing such stretchable interconnects. It is also aimed at providing an improved process for forming such stretchable interconnects and sensor arrays.

DETAILED DESCRIPTION OF THE INVENTION

While the present invention will be described in connection with a preferred embodiment thereof, it will be understood that it is not intended to limit the invention to that embodiment. On the contrary, it is intended to cover all alternatives, modifications, and equivalents as may be included within the spirit and scope of the invention as defined by the appended claims.

Figure 1:
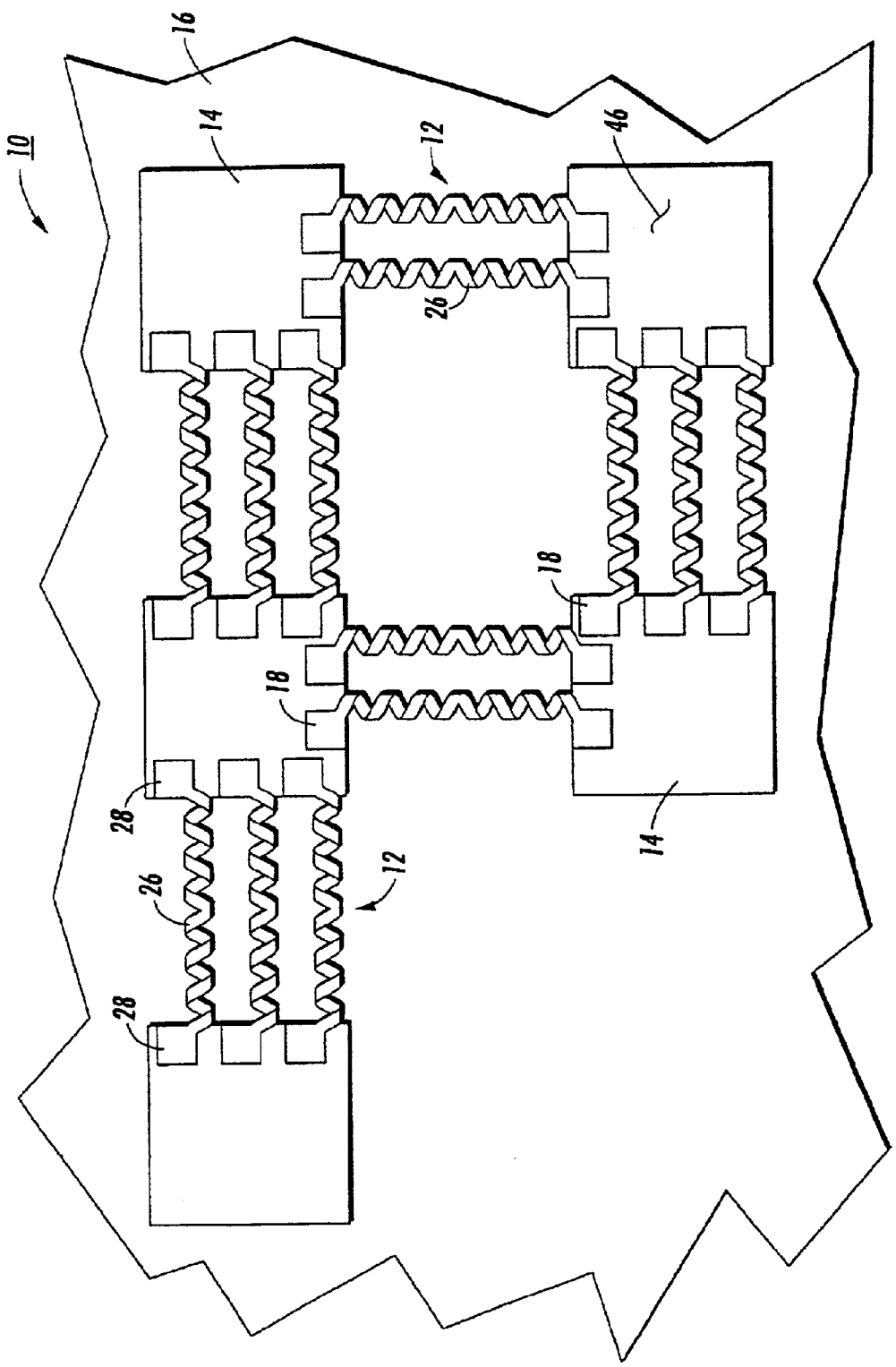
FIG. 1 is top view of a sensor array having stretchable interconnects in accordance with a preferred embodiment of this invention.

Referring to FIG. 1 there is shown a sensor array 10 in accordance with a preferred embodiment of the invention. In accordance with this embodiment there is provided a stretchable interconnect 12 for electrically connecting electronic devices 14 which are supported for movement relative to one another by a flexible and/or stretchable substrate 16. The electronic devices can comprise sensors, circuit elements, control elements, microprocessors or any other desired electronic device, as well as combinations of the foregoing. Preferably they comprise MEMS style transducers or sensors and associated electronics. Anisotropically resistive materials, semiconductor piezoresistors, piezoelectric transducers, capacitive sensors, acoustic sensors, photoelectric sensors, and other conventionally used sensors are exemplary of sensors which could be employed as electronic devices in accordance with this invention.

Capacitive membrane pressure sensors can be used to detect tactile forces. Piezoresistive layers can be used to sense stress in spring contacts 12 to infer distension of the springs. LEDs can emit light (e.g. pulses) and reflected light can be detected by integrated photodiodes or phototransistors in the devices 14 to sense proximity. Acoustic emissions could be used for sonar like detection of proximity. Many other uses of sensor arrays of this invention are possible.

The interconnect 12 comprises a photolithographically patterned stretchable conductor, preferably a coiled conductor, connected between respective contact pads 18 of two adjacent electronic devices 14 for electrically coupling a contact 18 of one device 14 to a contact 18 of another device 14. In a particularly preferred embodiment of the invention, which will be described in greater detail later, the contact pads 18 overlie resistive piezoelectric sensors incorporated in the electronic devices 14. This embodiment is particularly adapted to provide tactile sensing in a robot or other application requiring such sensing. The piezoelectric sensors of the electronic devices 14 sense changes in the spring tension of the stretchable interconnect 12 in order to determine force, torque etc., applied by, for example, fingers of a robot.

Figure 2:
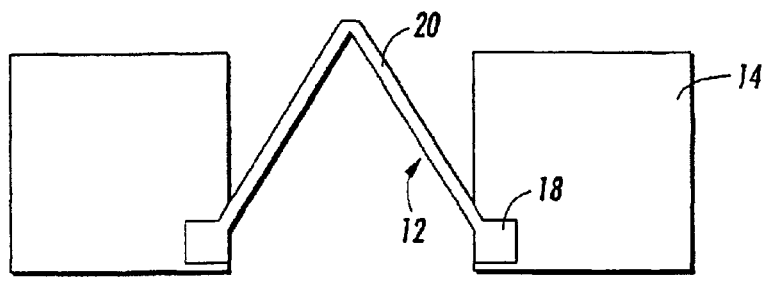
FIG. 2 is top view of a stretchable interconnect in accordance with one preferred embodiment, after patterning.
Figure 3:
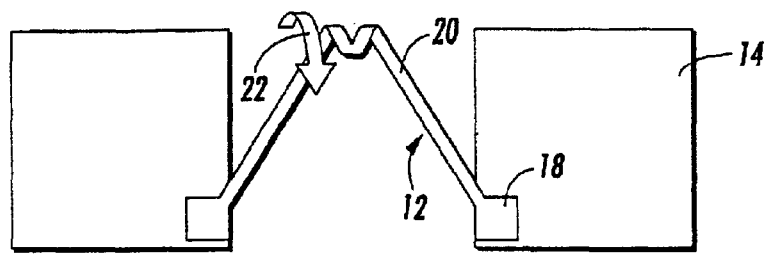
FIG. 3 is a top view of the interconnect of FIG. 2 as it is freed from the substrate.
Figure 4:
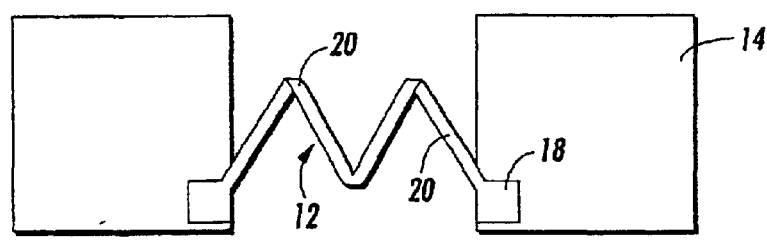
FIG. 4 is top view of a stretchable interconnect in accordance with another preferred embodiment, after patterning.
Figure 5:
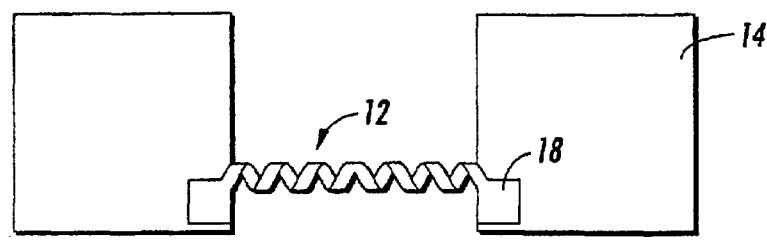
FIG. 5 is a top view of the interconnect of FIG. 4 after it has been freed from the substrate.

Referring to FIGS. 1–5, in a particularly preferred embodiment the stretchable interconnect 12 is photolithographically patterned and prior to being formed into a coil comprises at least one "V" shaped section 20 as in FIG. 2., which when unsupported forms the stretchable conductor, which is preferably a coil as in FIG. 3, by rotating in the direction of arrow 22. Most preferably the stretchable interconnect 12 comprises a plurality of "V" shaped sections 20 as in FIG. 4, which when unsupported form the stretchable conductor, which is preferably a coil 12 as in FIG. 5. By using the "V" shaped sections the coiled conductor achieves a preferred di-helic structure. Here "V" shaped is intended to include variations such as rounding at vertices of the V's as well as other shapes to reduce stress concentration.

Figure 6:
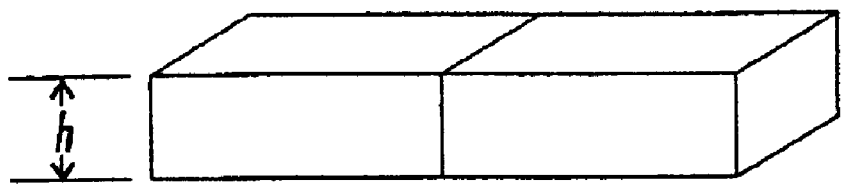
FIG. 6 shows a metal strip with no stress gradient.
Figure 7:
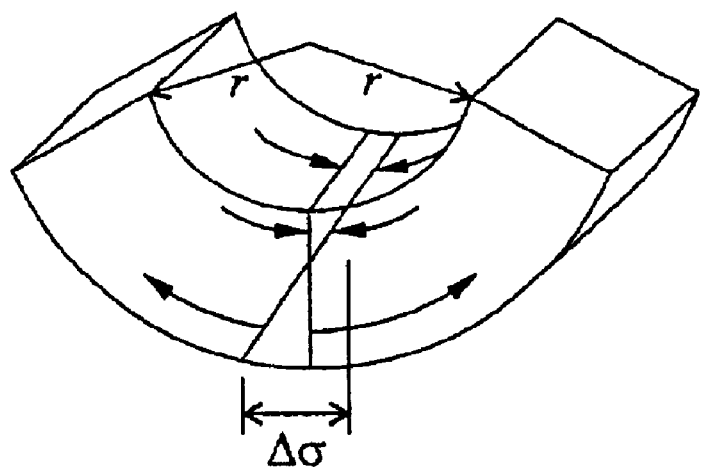
FIG. 7 shows the curvature of a stretchable interconnect due to the stress gradient.

The coiled conductor type stretchable interconnect 12 is comprised of a conductive material having a stress gradient extending through at least a portion of the thickness of the conductor. As shown in FIG. 6, a strip of metal 24 having no stress gradient inherent in the metal will lie flat. However, as shown in FIG. 7, when a uniform stress gradient is introduced into the strip of metal 24, the strip bends into an arc. When the strip coils into the third dimension the accumulated stress relaxation pulls the contacts 18 closer together. When contacts 18 are pulled apart interconnects 12 unwind. Even if strip of metal 24 is initially flat when released, pulling apart of contacts 18 deforms the patterned shape of interconnects 12 and causes them to buckle into the third, out-of-plane, dimension.

Each coil type stretchable interconnect 12 is formed such that a stress gradient as exemplified in FIG. 7 is introduced into the metal layer making up the stretchable interconnect 12. When the stretchable interconnect 12 is formed, the metal layer is deposited such that compressive stress is present in lower portions of the metal layer and tensile stress is present in upper portions of the metal layer. This is referred to as a positive stress gradient. There is a stress difference $\Delta\sigma$ (i.e., the difference in stress from the top to the bottom) present in the stretchable interconnect 12. Compressive stress is present in lower portions of the metal layer (adjacent the contact 16). Tensile stress is present in the upper portions of the metal layer. The stress gradient (stress difference divided by thickness) causes the stretchable interconnect 12 to bend upwards into the shape of an arc having a radius r. In alternative embodiments films may be deposited with negative stress gradients wherein the metal layer is deposited such that tensile stress is present in lower portions of the metal layer and compressive stress is present in upper portions of the metal layer. Such layers, when released, coil downwards which can be beneficial by providing a more compact arrangement. In accordance with this invention positive or negative stress gradients may be employed as desired.

Equation 1 gives the radius of curvature r of the stretchable interconnect 12 when it is freed from support by the substrate:

$$r = \left(\frac{y}{1-v}\right)\frac{h}{\Delta\sigma} \quad (1)$$

where y is the Young's modulus of the metal, h is the thickness of the metal layer forming the stretchable interconnect 12, $\Delta\sigma$ is the stress difference, and v is the shear modulus of the metal. Additionally, the stretchable interconnect 12 is preferably of an elastic material which will not plastically deform or take a set in use.

The metal layer 20 comprising the stretchable interconnect 12 may be formed by any desired conventional means. Preferably the coil type interconnect is sputter deposited in several sub-layers 12-1 to 12-n (not shown) to provide a final thickness h of approximately from about 0.5 $\mu$m (micrometers) to about 5 $\mu$m and most preferably about 1 $\mu$m. The stress difference $\Delta\sigma$ is introduced into the stretchable interconnect 12 by altering the stress inherent in each of the sub-layers 12-1 to 12-n of the stretchable interconnect 12, for example, each sub-layer 12-x has a different level of inherent stress.

Different stress levels can be introduced into each sub-layer 12-x of the deposited stretchable interconnect 12 during sputter deposition in a variety of ways, including adding a reactive gas to the plasma, depositing the metal at an angle, or varying the deposition angle, and changing the pressure of the plasma gas. Preferably, the different levels of stress are introduced into the stretchable interconnect 12 by varying the pressure of the plasma gas, which is preferably argon.

Figure 8:
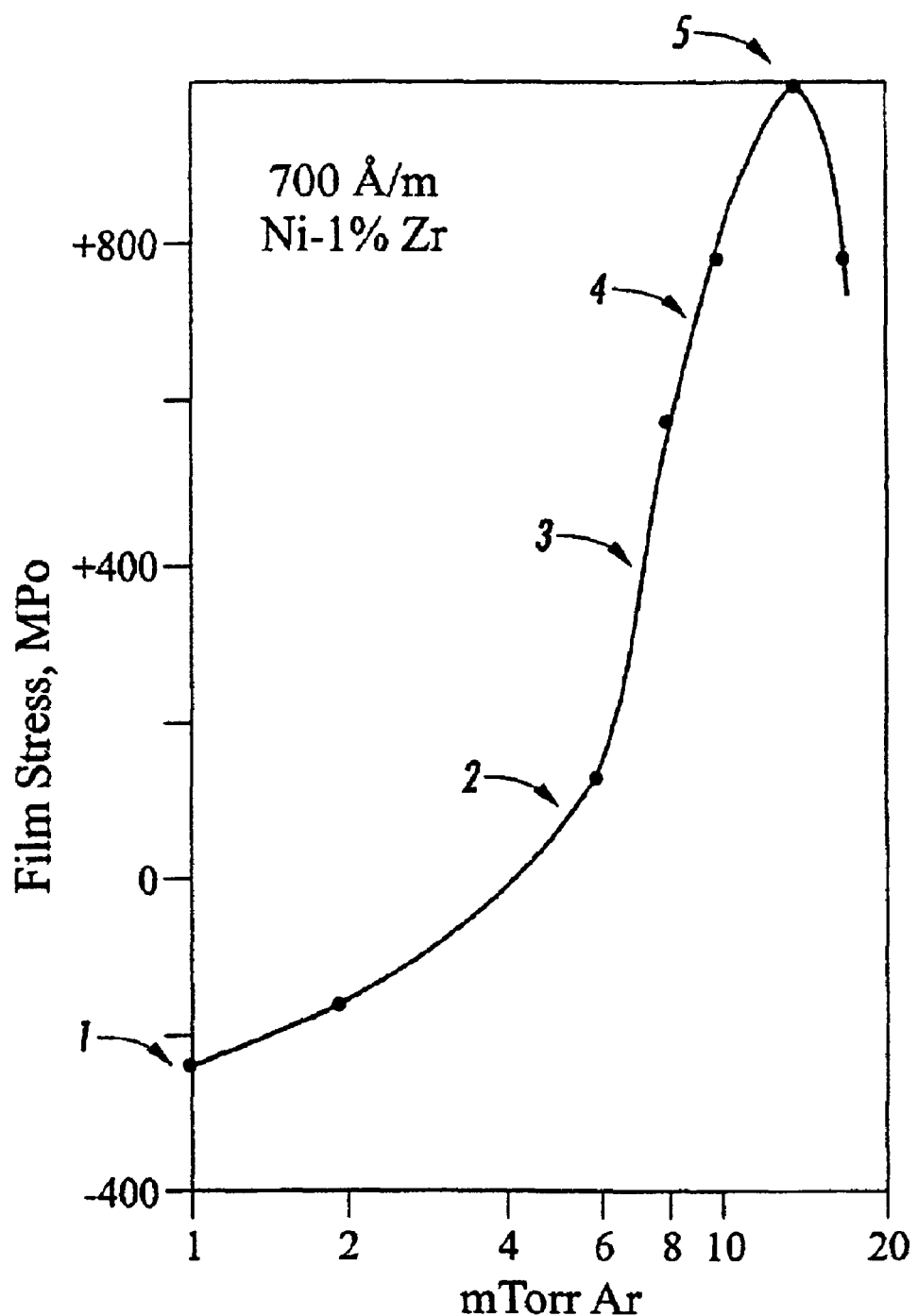
FIG. 8 is a graphic representation of the film stress in a sputter deposited nickel-zirconium alloy as a function of plasma gas pressure.

FIG. 8 is a graph showing the relationship of the metal layer stress in a sputter deposited nickel-zirconium alloy and the pressure of the plasma gas used in the deposition. For low pressures of the plasma gas, approximately 1 mTorr, (milli-Torr) the film stress in the deposited sub-layer is compressive. As the pressure of the plasma gas increases, the film stress in the deposited sub-layer changes to a tensile stress and increases with increasing plasma gas pressure.

Preferably, the stretchable interconnect 12 is deposited in at least about five sub-layers 12-1 to 12-5. The first sub-layer 12-1 is deposited at a plasma gas pressure of 1 mTorr, as indicated by numeral 1 in FIG. 8. The first sub-layer 12-1 is the bottom-most layer in the stretchable interconnect 12 and has an inherent compressive stress. The second sub-layer 12-2 is deposited on top of the first sub-layer 12-1 at a plasma gas pressure of approximately 6 mTorr. The second sub-layer 12-2 has a slight inherent tensile stress, as indicated by numeral 2 in FIG. 8. Sub-layers 12-3, 12-4 and 12-5 are then deposited one on top of the other at the plasma gas pressures indicated by numerals 3, 4 and 5 in FIG. 8.

The process of depositing the stretchable interconnect 12 in five separate sub-layers 12-1 to 12-5 results in the stretchable interconnect 12 having a stress difference $\Delta\sigma$ which is compressive in the lower portion of the stretchable interconnect 12 and becomes increasingly tensile toward the top of the stretchable interconnect 12. Although the stress gradient urges the stretchable interconnect 12 to bend upward into an arc, the stretchable interconnect 12 adheres to the contact pads 18 to which it is secured.

Each released stretchable interconnect 12 comprises a free portion 26 and anchored portions 28 at opposing ends of the interconnect which are metallurgically bonded to a contact pad 18. Each stretchable interconnect 12 is made of an extremely elastic material, such as a chrome-molybdenum alloy or a nickel-zirconium alloy. Preferably, the stretchable interconnects 12 are formed of an elastic conductive material, although they can be formed of a non-conductive or semi-conductive material if they are coated or plated with an elastic conductive material. More preferably, the stretchable interconnects 12 are formed of a nickel-zirconium alloy having about 1% by weight zirconium. Zirconium is added to the alloy to improve the elastic properties of the alloy while not greatly affecting the conductivity of the alloy. When the elastic material is not conductive, it is coated on at least one side with a conductive material, such as a metal or metal alloy.

The contact pad 18 is the terminal end of a communication line which electrically communicates with an electronic device or circuit element. The contact pad 18 is typically made of aluminum, but can be made of any conductive material.

Figure 11:
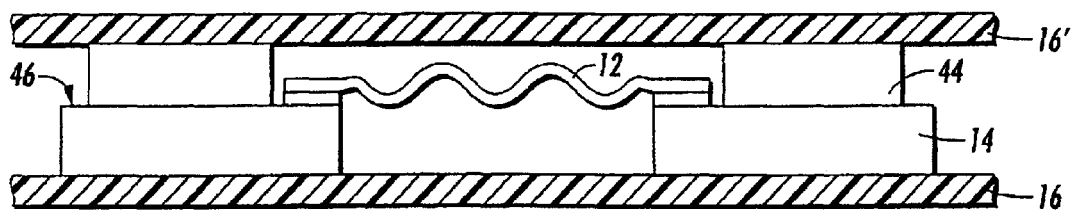
FIG. 11 is a side view of a sensor array produced in accordance with a preferred embodiment of the invention, using the process illustrated in FIG. 10.

Referring to FIGS. 1 and 11, in accordance with yet another embodiment of the invention a sensor array 10 is provided which comprises at least two electronic devices 14 which are supported for movement relative to one another on a stretchable substrate or skin 16. The skin 16 is not essential but is highly beneficial. The array 10 includes at least one and preferably a plurality of stretchable interconnects 12 for connecting the electronic devices 14. As in the previous embodiment the interconnect 12 preferably comprises: a photolithographically patterned coiled conductor extending between the devices 14 for electrically coupling a contact 18 of one device 14 to a contact 18 of another device 14 but can be a non-coiled, non-vetically-stressed metal interconnect. The coiled conductor type stretchable interconnect 12 is also formed of a conductive material and has a stress gradient extending through a thickness of the conductor formed in the manner described above. The interconnect 12 as photolithographically patterned and prior to coiling preferably comprises at least one "V" shaped section, which when unsupported, forms the coil. Most preferably it comprises a plurality of "V" shaped sections, which when unsupported form the coil. The coil 12 is most preferably di-helic. A coil having single helicity tightens and binds when stretched. A di-helic coil opens out in a relatively unconstrained manner and thus allows greater extensibility.

The sensor array 10 preferably comprises a tactile sensing array, however, there are many other uses of such an array 10, including, for example, flexible displays. In a particularly preferred embodiment the sensing array comprises a tactile sensing skin of a robot or a transduction glove for a human user. The sensor array 10 in accordance with the preferred embodiment is arranged in a flexible and stretchable skin 16 of the robot. The sensor array 10 preferably includes a plurality of the stretchable interconnects 12.

Figure 9:
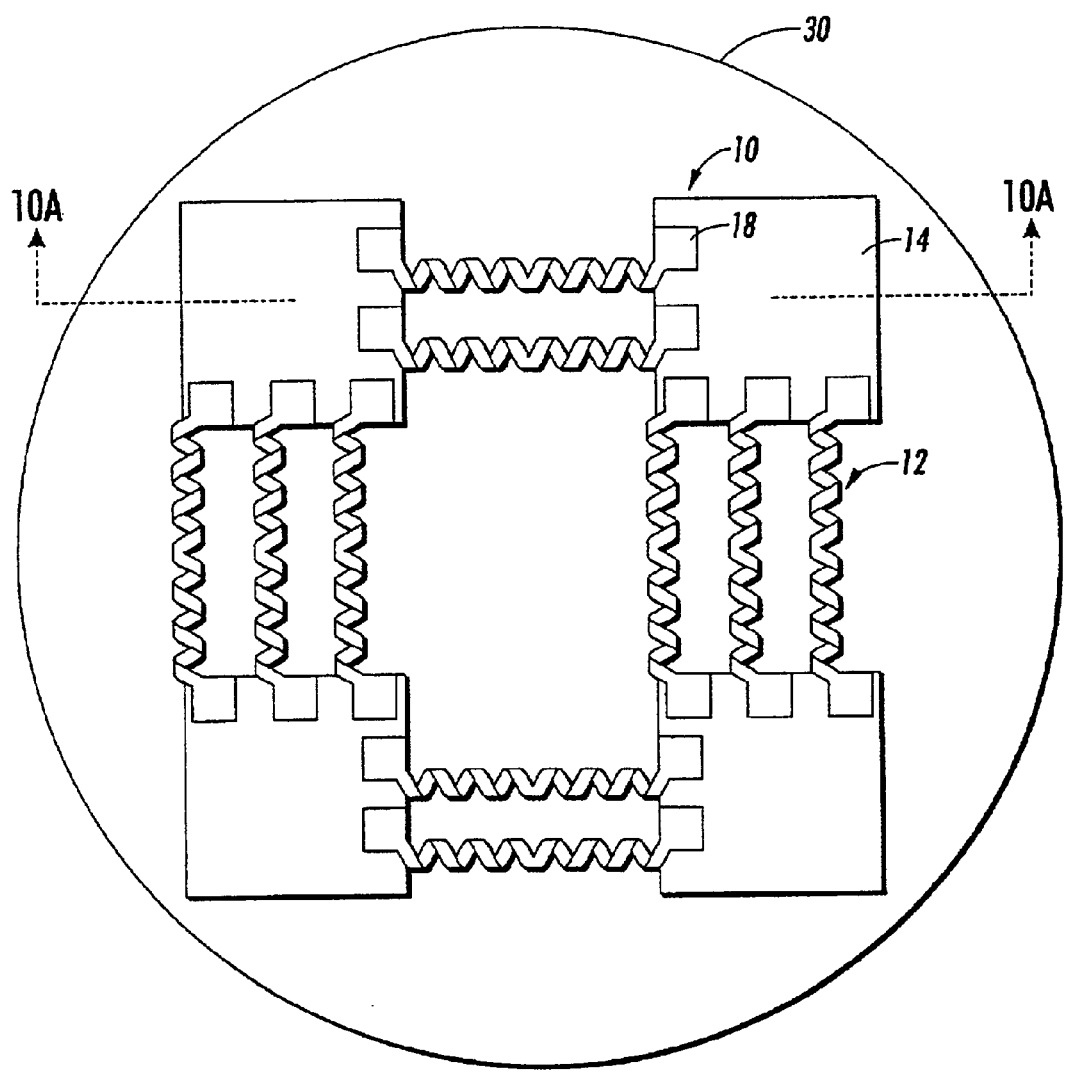
FIG. 9 is top view of a sensor array formed on a wafer substrate, having stretchable interconnect patterns in accordance with a preferred embodiment of this invention.

FIGS. 9–11 show the basic steps in a preferred embodiment of a method for forming a sensor array 10 having stretchable interconnects 12. The process (except for providing the stress gradient in the interconnects 12) uses essentially the same planar technology used to form integrated circuit chips or other electronic devices in a semiconductor wafer 30 such as silicon. As shown in FIG. 10A the electronic devices 14 are formed in the wafer 30 in a conventional manner. The process of forming the electronic devices 14 does not form part of the present invention. Thereafter, contact pads 18 are formed on the appropriate circuit connections of the devices 14. The contact pads 18 may be deposited by any conventional means such as sputtering, vapor deposition, etc.

Figure 10A:
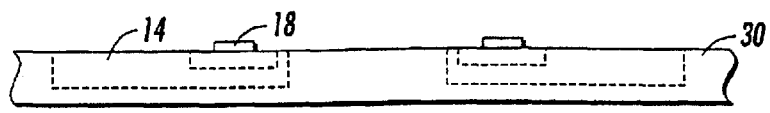
FIGS. 10A–10E comprise a series of side views in partial cross-section for illustrating a preferred embodiment of the process for making the sensor array of FIG. 1.
Figure 10B:
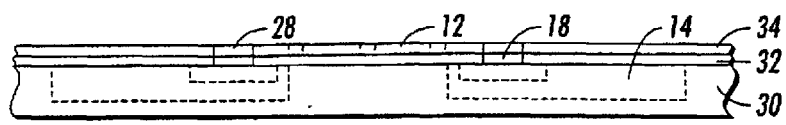

As shown in FIG. 10B a protective planarization layer 32 is then optionally applied to provide a smooth planar surface for further deposition, however, by suitable masking the contacts 18 are not covered over by the layer 32. The planarization layer may be any desired conventional material for such use. Typically it comprises a polymeric material, such as polyimide or BCB (benzocyclobutene). Thereafter a layer of metal 34, from which the stretchable interconnects 12 will be formed, is deposited uniformly over the wafer 30. In the preferred embodiment of the invention, the metal is the nickel-zirconium alloy described above, however, any desired metal or alloy which is sufficiently elastic and conductive to become a stretchable interconnect 12 could be employed. Parts 28 of the metal layer 34 are electrically connected to or directly bonded to the contact pads 18. There are many methods available for depositing a metal layer 34 on or over the substrate wafer 30, including electron-beam deposition, molecular beam epitaxy, chemical vapor deposition, sputter deposition, etc. Most preferably, the metal layer is sputter deposited.

When sputter depositing a metal layer 34, the metal to be deposited is placed on a target and set to a high negative voltage. A stream of plasma gas, typically argon, is directed towards the target. The high voltage potential between the plasma gas and the target metal produces ions which are accelerated toward and bombard the metal target. This bombardment knocks small particles of the metal target free and the freed particles are guided to the surface where they are deposited.

After the metal layer 34 is deposited, it is photolithographically patterned into the stretchable interconnects 12. Photolithographic patterning is a well-known technique and is routinely used in the semiconductor chip industry. In the photolithographic process photosensitive material is evenly deposited on the top surface of the metal layer 34. The photosensitive layer (not shown) is then soft-baked at a temperature of, for example, 120° F. The photosensitive layer is then exposed to light, typically in the ultra-violet spectrum, using an appropriate mask. The mask ensures that areas of the photosensitive material are appropriately exposed to the light, which provides a two-dimensional pattern corresponding to the stretchable interconnects 12.

Figure 10C:
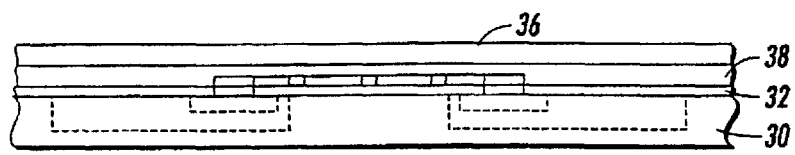

Once the photosensitive material is exposed to the appropriate pattern of light, the photosensitive material is developed and hard-baked at a temperature of, for example, 200° F. The metal layer 34 is then etched (not shown) to form the stretchable interconnects 12 as shown in FIGS. 9 and 10C. Different methods for etching can be used, including ion milling, reactive ion etching, plasma etching, wet chemical etching, etc. Preferably, wet chemical etching is used.

The wet chemical etchant, for example, a nitric acid solution, removes appropriate areas of the photosensitive material, determined by which areas of the photosensitive material were exposed or not exposed to the light, as the case may be, and the type of photosensitive material used. After the appropriate areas of photosensitive material are removed, the etchant removes the areas of the metal layer 34 lying under the removed areas of photosensitive material. The remaining areas or patterns of the metal layer 34 form the stretchable interconnects 12 after the photoresist is removed. A top-view of exemplary patterns of stretchable interconnects 12 so formed is shown in FIG. 9.

Since the process for forming the stretchable interconnects 12 is limited only by the design rules of photolithographic patterning, the stretchable interconnects 12 can be formed closely together in a relatively small area on the electronic devices 14. The typical width of the stretchable interconnect 12 is from about 1 to about 100 microns. The spacing between stretchable interconnects 12 is related to the maximum diameter of the coils and therefore depends on the process variables. Non-coiling interconnects can be spaced apart by as little as a few microns, if electrically insulated as described below.

Referring again to FIG. 10C a rigid substrate 36 is then secured to the top surface of the planar coated 32 wafer 30 by a layer of a releasable adhesive 38 which embeds the interconnects 12 between the substrate 36 and the planarization layer 32. Optionally the adhesive 38 can be pre-patterned in a way to leave the interconnects 12 free of adhesive. The substrate 36 may be any desirable material such as a metal, rigid plastic, or glass but most preferably is glass which is transparent to UV light. The adhesive may be any desired material which is capable of adhering the substrate 36 to the wafer 30 and after further processing of the wafer, is capable of releasing the substrate 36 from the wafer. A suitable release adhesive 38 comprises an adhesive layer such as the SP series from Furukawa [http://www.furukawa.co.jp/uvtape/en/sp.htm] which can be released by exposure to UV light applied through the transparent substrate 36. Other conventional adhesive layers 38 could be employed, such as water or solvent based polymers [e.g. starch which can be dissolved in water or e.g. an acrylic adhesive which can be dissolved in an organic solvent] to release the substrate 36. The releasable substrate 36 is intended to hold the devices 14 rigidly in place and prevent the interconnects from curling into coils until after further processing.

Figure 10D:
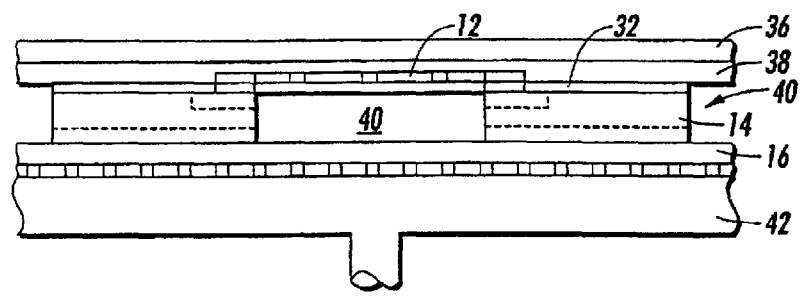

Referring now to FIG. 10D the wafer 30 is then etched to remove portions thereof 40 which extend between the devices 14. This also releases the restraint on the interconnect 12 so that it preferably forms into a di-helic coil under the influence of the internal stress gradients as explained above by reference to FIGS. 2–4. The etching may be accomplished by any conventional means, such as for example reactive ion etching, however, wet chemical etching could also be employed. The etching will also remove the planarization layer 32 under the interconnects 12. During the etching of the portions 40 of the wafer the rigid substrate 36 holds the devices 14 and interconnects in place. An optional conformal coating, (not shown) such as parylene, can be deposited on the springs to provide a dielectric insulation layer. A stretchable and/or flexible material or skin 16 such as silicone is then secured or bonded to the back side of the electronic devices 14 by a suitable conventional adhesive or by curing of the skin.

Thereafter, a vacuum chuck 42 is brought into contact with the skin 16 and a vacuum is applied to hold the devices 14 rigidly in place. The rigid substrate 36 is then illuminated with UV light to detack the adhesive layer 38 and convert it to its releasable condition, whereupon the substrate 36 and adhesive layer 38 is removed as in FIG. 10E. Alternatively the adhesive layer 38 can be detached through the use of an appropriate solvent.

If the stress gradient is negative from the contact 18 surface upward in the interconnect 12 then the interconnect 12 curves downward providing the most compact arrangement, since it extends into the void 40 between the devices 14. A positive stress gradient from the contact 18 surface upward in the interconnect 12 could also be employed, however, the interconnect would curve upward which would provide a less compact arrangement.

Figure 10E:
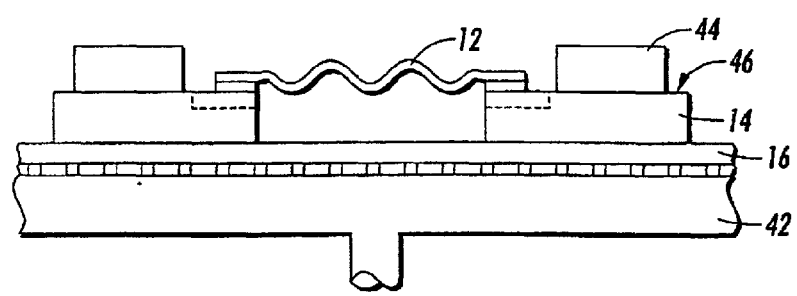

To provide the most preferred sensor array 10 the devices 14 are preferably sandwiched between flexible and/or expandable substrate materials 16 and 16' arranged on opposing sides of the array 10 as shown in the preferred embodiment of FIG. 11. Referring to FIGS. 10E and 11 in order to accomplish this structural arrangement mesas 44 are secured or deposited on the top surfaces 46 of the devices 14 to insure that the substrate material 16' will clear the interconnects 12. The mesas 44 may be formed of any desired material such as, for example, a thick film photopolymer such as Riston, made by DuPont. The Riston is patterned photolithographically to form the mesas. After the substrate material 16' is applied to the array 10 and cured the vacuum on the chuck 42 is removed so that the chuck may be removed leaving the completed array 10 which may be placed in a suitable support frame 48 as in FIG. 14.

Figure 14:
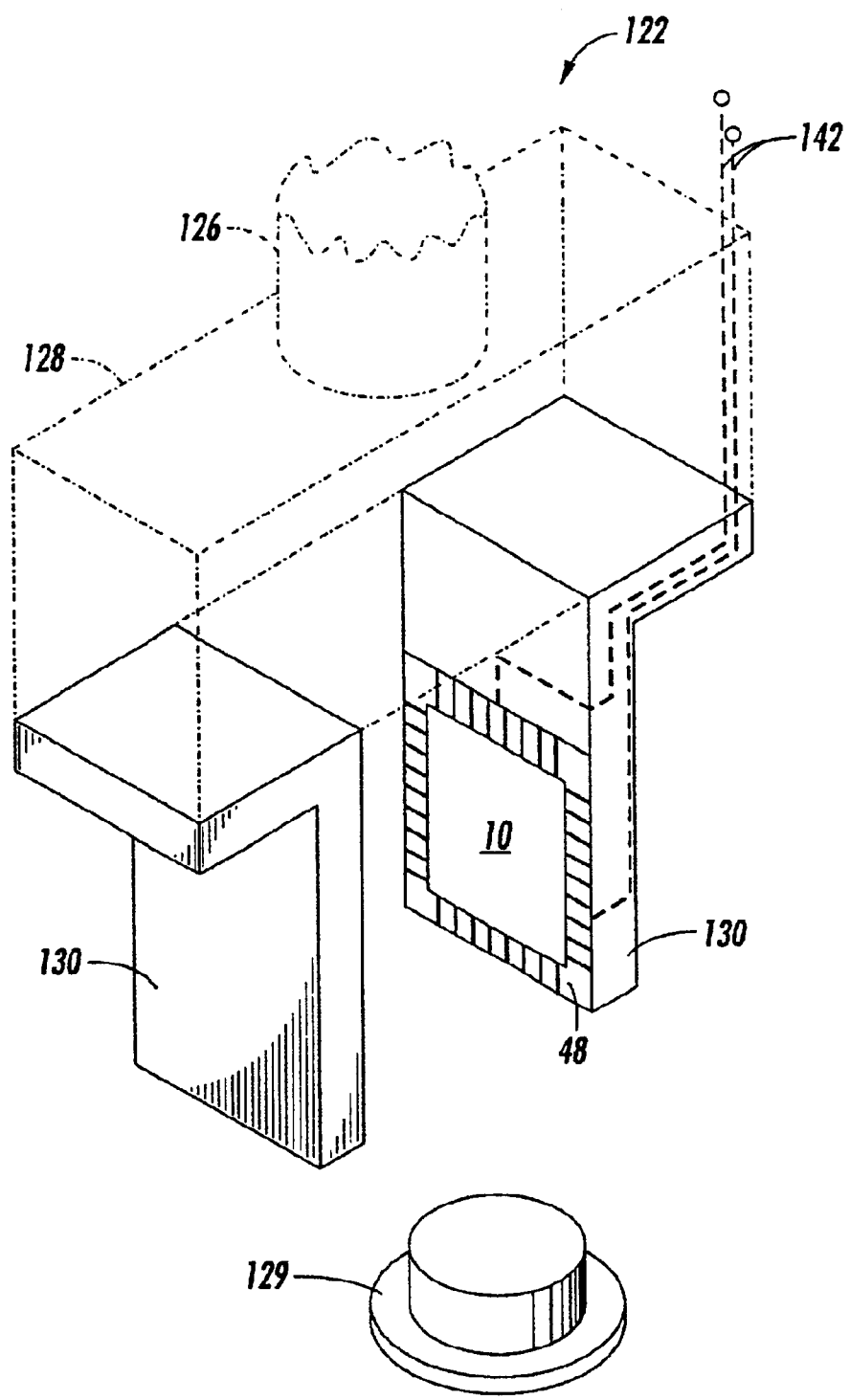
FIG. 14 is an enlarged perspective view of the fingers of the robot of FIG. 13 employing a tactile sensing array as in accordance with this invention.

The sensor array 10 may if desired be supported within a suitable frame 48 as shown in FIG. 14. A peripheral gasket (not shown) preferably surrounds the array 10 and extends between the substrate materials 16 and 16' which are secured to the gasket by a clamping metal frame 48 or by an adhesive or any other desired means. If desired the vacuum chuck may be left in place until the frame 48 has been mounted to the array 10.

The sensor array 10 of this invention may be constructed by a number of processes. An alternative preferred embodiment of the process of this invention which minimizes the wastage of the semiconductor wafer 30 material will now be described by reference to FIGS. 12A–12D: In this embodiment the sensor devices 14 are fabricated by conventional semiconductor processing and provided as chips containing processing electronics and transduction means as described above. The chips have contacts 18 and are arranged for mounting in the array 10 by using a "flip chip" technique as is known in the art.

Figure 12A:
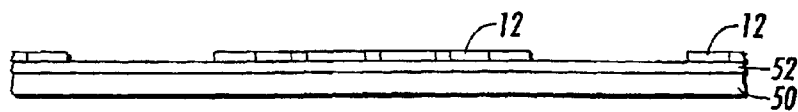
FIGS. 12A–12D comprise a series of side views in partial cross-section for illustrating an alternative preferred embodiment of the process for making the sensor array of FIG. 1.
Figure 12B:
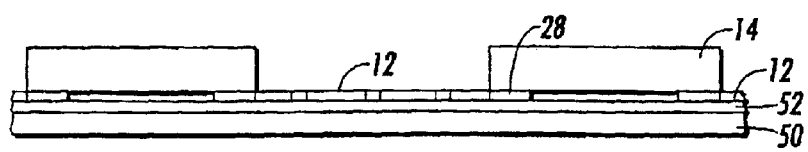
Figure 12C:
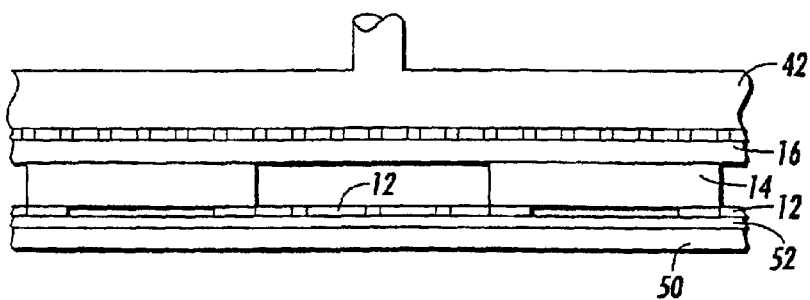
Figure 12D:
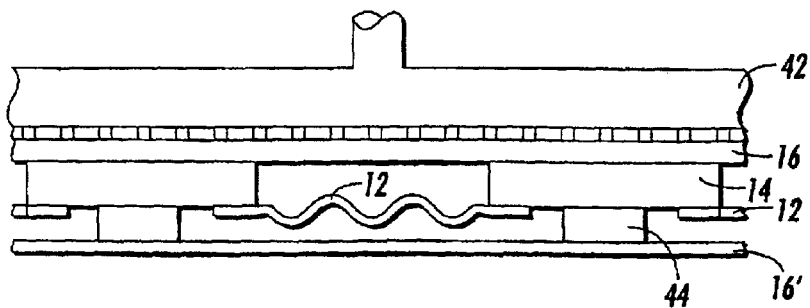

Referring to FIG. 12A a large area substrate 50, which is preferably glass or some other inexpensive material, is coated with a release or sacrificial layer 52 such as a metal (e.g. aluminum or titanium), dielectric (e.g. silicon oxynitride), or other selectably soluble material. A metal layer such as the layer 34 in the previous process is then deposited on the sacrificial layer 52 and photolithographically patterned as previously described into an array of stretchable interconnects 12. Referring to FIG. 12B, the contacts 18 of the electronic devices 14 are then flip-chip bonded to the respective ends 28 of the stretchable interconnects 12. As shown in FIG. 12C a flexible and or stretchable material or fabric substrate 16 is bonded as in the previous embodiment to the back sides of the devices 14. Thereafter a vacuum chuck 42 is clamped to the substrate 16 to rigidly hold it in place. Referring to FIG. 12D the sacrificial layer 52 is released or dissolved in the manner of the layer 38 in the previous embodiment thereby permitting removal of the large area substrate 50. The removal of the sacrificial layer 52 frees the interconnects 12 to form their respective coils. Not shown in FIG. 12 are holes through the large area substrate 50 to allow rapid access of solvent to the sacrificial layer.

Mesas 44 are then formed on the devices 12 as in the previous embodiment and the substrate 16' is secured to the mesas as described above. The array 10 is then completed as in the previously described embodiment and after removal of the vacuum chuck 42 an array 10 is provided as shown in FIG. 11.

The arrays 10 of this invention have application in a variety of uses as follows: Stretchable and conformable arrays can be used to cover non-planar surfaces and distended to comply with relative movements of elements of the structure. Such coverings can be used to create transducer skins for robots or humans. Sheets of the material can be cut non-destructively through the flexible contacts to allow many shapes from the same fabric. Stretchable, conformable skins allow high density, small area electronics to be arrayed over large areas. For machines such skins can provide proximity, collision, vibration and force detection. By adding actuation capabilities to the chips systems can become active; e.g. material composition can be sensed by actively injecting heat (or cooling) from the chip into the contacted object and sensing temperature rise (or fall.) The thermal conductivity measured can be used to infer material characteristics about the object. Optical output and sensing within the stretchable, conformable skin also leads to novel capabilities. For example, a deformable, sparse array of CMOS or CCD sensors can be used instead of deformable optics to sense images over a large area and correct for fluctuations in the image phase front. An electronic chameleon effect (active camouflage) can be achieved if one side of the chiplets senses the optical properties of a surface on which the skin is stretched, and the other side displays the same or different optical properties. Microphone arrays can sense sound fields on non-planar surfaces, locally process the information and abstract information on the size scale appropriate to the sound wavelengths being imaged. Omnidirectional beam forming could be enabled by stretching an array of sound actuators onto a spherical surface. Stress, strain, shear stress and flow affecting wings of planes could be sensed, particularly in the regions of stress concentration. Relatively transparent sensor/actuator array meshes could be applied for example to windshields. Clothing could be instrumented. Such sensing skins could be adhered to biological tissues, for example the heart, to sense beating patterns.

Figure 13:
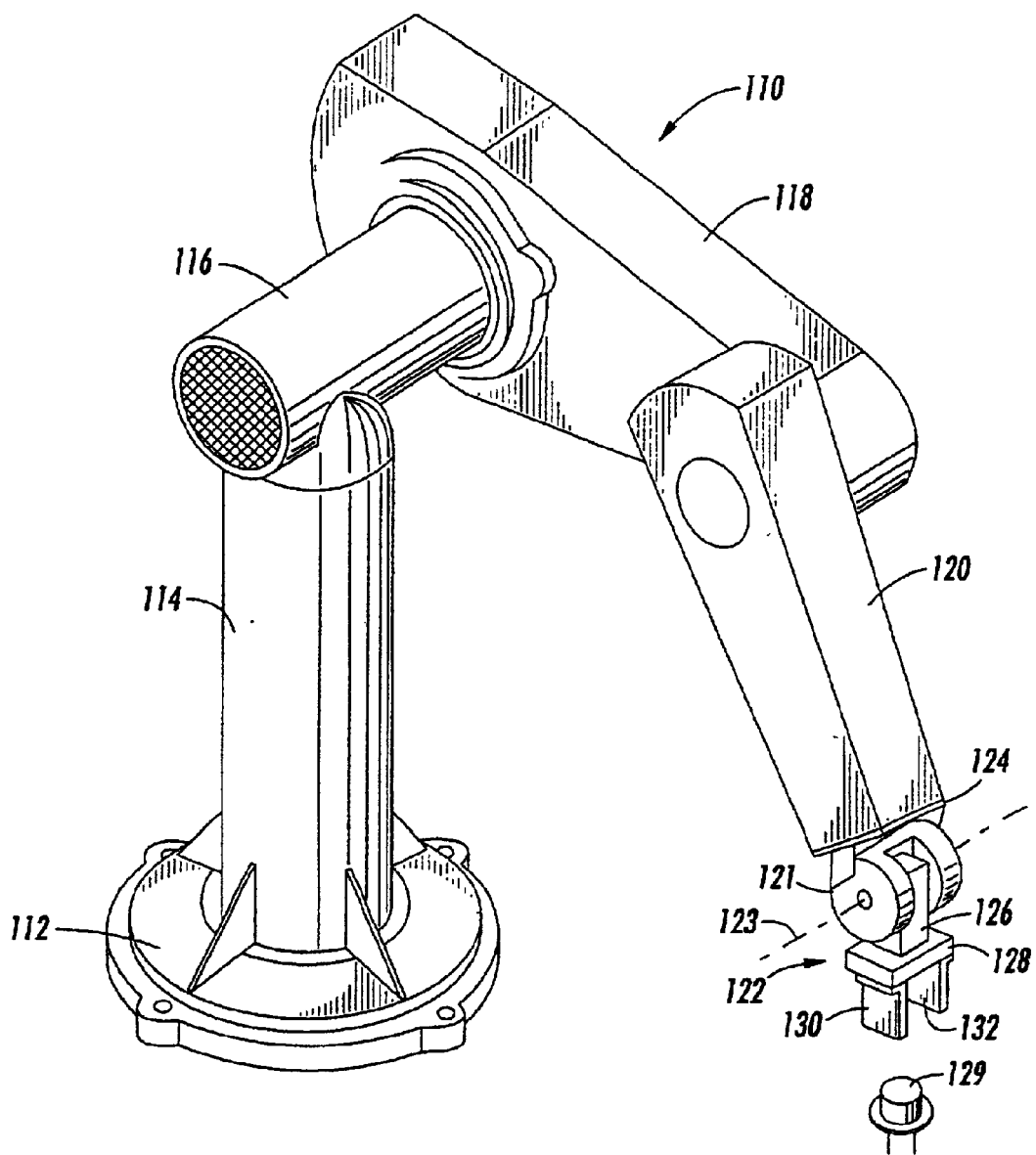
FIG. 13 is a perspective view of an exemplary robot employing a sensor array in accordance with a preferred embodiment of this invention.

One application for which the sensor array 10 of this invention is particularly adapted is as a tactile sensing array of a robot. With reference now to FIGS. 13 and 14, there is shown a robot 110 as described in U.S. Pat. No. 4,588,348 incorporated by reference herein. It comprises a base 112, a vertical cylindrical body 114 mounted on the base, a shoulder member 116 cantilevered at the top of the body 114, an upper arm 118 pivotally mounted at one end to the shoulder member 116 and at the other end to forearm 120. The extremity of forearm 120 includes a pneumatic or servo-driven hand commonly termed a gripper 122 which is pivotally mounted thereto to enable rotation about three axes. The gripper 122 includes a base 121 which rotates about the axis of forearm 120, a post 126 which pivots about axis 123 of flanges 124, and a palm member 128 which rotates about the axis of post 126. A pair of fingers 130 are slidably mounted on the palm member 128. However, if desired, the fingers 130 may be pivotally mounted as described U.S. Pat. No. 4,541,771 also incorporated by reference herein.

In accordance with an embodiment of this invention, at least one, and preferably both, of the facing surfaces 132 of the fingers 130 are provided with a tactile array 10 of sensors 14. Stretchability and conformability are particularly beneficial around joints. The signals generated by array 10 in response to forces applied thereto in handling object 129 are coupled via cables 142 to a suitable processor (not shown).

In use, object 129 might be, for example, a package or header for a semiconductor component. Since the object may be delicate, the gripper 122 should be able to pick it up without crushing it (hence the normal force should be sensed), without dropping it or allowing it to slip (hence tangential force should be sensed), and without allowing it to rotate (hence torque should be sensed). The tactile arrays 10 of this invention are capable of sensing such properties depending on the types of sensors 14 which are used.

For purposes of illustration, a square array 10 is depicted, however the array may have any desired shape. Since the arrays 10 of this invention are flexible as well as stretchable they can be employed on curved as well as flat surfaces. Each sensor 14 in the array is connected to a signal processor (not shown) which, in turn, supplies an output, indicative of a force applied to the sensor. The output is coupled to a controller (not shown) which controls the position of the robot 110; i.e., the position of its hand, gripper or other movable part used to handle object 129.

As noted previously, the tactile array of this invention need not be mounted on a robot; it could be mounted, for example, on a table top and the object could be carried to the array. In this way, the array 10 can be used to quantify the force applied by the object or to identify the shape of the object, and to supply the results to a control or a display (not shown).

Gloves for human use could be applicable to transduce tactile cues for recording or for displaying to teleoperators.

If desired a layer of gold or other high conductivity metal can be plated over the outer surface of each stretchable interconnect 12. The layer of gold is preferably used to reduce the resistance in the stretchable interconnects 12, but can be replaced with any other conductive material.

The stretchable interconnect 12 can be flexed and stretched. For the coil type interconnect stretching causes the coil to unwind, unlike a coil of single helicity which tightens to a hard limit. The coil 12 can in principle extend to a distance of 2 nL where L is the length of an arm of a V shaped section 20 and n is the number of V shaped sections in the interconnect 12. While V shaped sections 20 are preferred other serpentine structures can be employed. A secondary feature of di-helic interconnects is that the induced magnetic fields within the coil tend to cancel. Thus the inductance of the interconnects 12 is relatively small, as compared to a single helicity coil.

The process of this invention is parallel in nature, batch compatible, and a high yield method of producing high numbers and high densities of interconnects 12. The interconnects 12 of this invention are formed from a single planar entity, as opposed to bonding of multiple sub-units. The interconnects 12 can be di-helic which provides low inductance connections. The interconnects 12 are stretchable and flexible and can provide extensions much greater that the minimum inter-chip spacing. The coils type interconnects 12 unwind instead of tightening. The coiling of the interconnect 12 acts as a natural strain relief at the metallurgical bond between the contact pad 18 and the portion 28 of the interconnect. A "sensitive skin" fabric of display material or other electronic utility can be provided by interconnecting chiplets using the interconnects 12 of this invention. Stretchable arrays can also be used to span areas larger than the process areas thus allowing fabrication of large area structures without the need for post processing tiling.

While it is possible to use essentially two dimensional interconnects (e.g. planer members prior to bending or stretching) it is clearly preferred to use three dimensional coiled type interconnects.

It should be understood that the foregoing description is only illustrative of the invention. Various alternatives and modifications can be devised by those skilled in the art without departing from the spirit of the invention. Accordingly, the present invention is intended to embrace all such alternatives, modifications and variances which fall within the spirit and scope of the appended claims.

What is claimed is:

1. A stretchable interconnect for electrically connecting electronic devices which are supported for movement relative to one another, comprising:

a photolithographically patterned stretchable conductor extending between two of said devices for electrically coupling a contact of one device to a contact of another device, said conductor being comprised of a conductive material, wherein said interconnect comprises a coiled conductor which as patterned has a stress gradient extending through at least a portion of the thickness of said conductor, and wherein as photolithographically patterned and prior to coiling said interconnect comprises at least one "V" shaped section, which when unsupported forms said coil.

2. The stretchable interconnect as in claim 1, wherein said interconnect comprises a plurality of "V" shaped sections.

3. The stretchable interconnect as in claim 1, wherein said interconnect comprises a plurality of "V" shaped sections, which when unsupported forms said coil.

4. The stretchable interconnect as in claim 1, wherein said coiled conductor is di-helic having two winding directions.

5. A sensor array comprising at least two electronic devices which are supported for movement relative to one another and at least one stretchable interconnect for connecting said electronic devices, said interconnect comprising: a photolithographically patterned stretchable conductor extending between said devices for electrically coupling a contact of one device to a contact of another device, said conductor being formed of a conductive material, wherein said interconnect comprises a coiled conductor which as patterned has a stress gradient extending through at least a portion of the thickness of said conductor, and wherein as photolithographically patterned and prior to coiling said interconnect comprises at least one "V " shaped section which when unsupported, forms said coil.

6. The sensor array as in claim 5, wherein said interconnect comprises a plurality of "V" shaped sections.

7. The sensor array as in claim 5, wherein said interconnect comprises a plurality of "V" shaped sections, which when unsupported form said coil.

8. The sensor array as in claim 5, wherein said coiled conductor is di-helic having two winding directions.

9. The sensor array as in claim 5, which comprises a tactile sensing array.

10. The sensor array as in claim 9 which comprises a tactile sensing portion of a robot.

11. The sensor array as in claim 10 wherein said sensor array is arranged in a flexible and stretchable skin of said robot.

12. The sensor array as in claim 5, which includes a plurality of said stretchable interconnects.

13. A stretchable interconnect for electrically connecting electronic devices which are supported for movement relative to one another, comprising:

a patterned stretchable conductor extending between two of said devices for electrically coupling a contact of one device to a contact of another device, said conductor being comprised of a conductive material, wherein said interconnect comprises a coiled conductor which as patterned has a stress gradient extending through at least a portion of the thickness of said conductor, and wherein as patterned and prior to coiling said interconnect comprises at least one section shaped to reduce stress concentration, which when unsupported forms said coil.

14. The stretchable interconnect as in claim 13, wherein said interconnect comprises a plurality of said shaped sections.

15. The stretchable interconnect as in claim 13, wherein said interconnect comprises a plurality of said shaped sections, which when unsupported forms said coil.

16. The stretchable interconnect as in claim 13, wherein said coiled conductor is di-helic having two winding directions.

17. A sensor array comprising at least two electronic devices which are supported for movement relative to one another and at least one stretchable interconnect for connecting said electronic devices, said interconnect comprising: a patterned stretchable conductor extending between said devices for electrically coupling a contact of one device to a contact of another device, said conductor being formed of a conductive material, wherein said interconnect comprises a coiled conductor which as patterned has a stress gradient extending through at least a portion of the thickness of said conductor, and wherein as patterned and prior to coiling said interconnect comprises at least one section shaped to reduce stress concentration, which when unsupported forms said coil.

18. The sensor array as in claim 17, wherein said interconnect comprises a plurality of said shaped sections.

19. The sensor array as in claim 17, wherein said interconnect comprises a plurality of said shaped sections, which when unsupported form said coil.

20. The sensor array as in claim 17, wherein said coiled conductor is di-helic having two winding directions.

21. The sensor array as in claim 17, which comprises a tactile sensing array.

22. The sensor array as in claim 21, which comprises a tactile sensing portion of a robot.

23. The sensor array as in claim 22 wherein said sensor array is arranged in a flexible and stretchable skin of said robot.

24. The sensor array as in claim 17, which includes a plurality of said stretchable interconnects.

* * * * *